United States Patent
Ohmura et al.

[11] Patent Number: 5,877,661
[45] Date of Patent: Mar. 2, 1999

[54] SURFACE ACOUSTIC WAVE FILTER WITH OPTIMALLY SIZED GAPS BETWEEN TRANSDUCERS

[75] Inventors: Masashi Ohmura; Hiroshi Honmo; Hidenori Abe, all of Toda, Japan

[73] Assignee: Kinseki, Limited, Tokyo, Japan

[21] Appl. No.: 737,372

[22] PCT Filed: Mar. 15, 1996

[86] PCT No.: PCT/JP96/00691

§ 371 Date: Jun. 17, 1997

§ 102(e) Date: Jun. 17, 1997

[87] PCT Pub. No.: WO96/28886

PCT Pub. Date: Sep. 19, 1996

[30] Foreign Application Priority Data

Mar. 15, 1995 [JP] Japan ................................. 7-082073

[51] Int. Cl.⁶ .................................................. H03H 9/64
[52] U.S. Cl. ......................... 333/193; 333/194; 333/195; 310/313 B; 310/313 D
[58] Field of Search .................................. 333/193–196, 333/190; 310/313 R, 313 B, 313 C, 313 D

[56] References Cited

FOREIGN PATENT DOCUMENTS

| | | | |
|---|---|---|---|
| 0 569 977 A1 | 11/1993 | European Pat. Off. ........... | 310/313 B |
| 61-192112 | 8/1986 | Japan . | |
| 64-82706 A | 3/1989 | Japan ...................................... | 333/195 |
| 1-231417 A | 9/1989 | Japan ...................................... | 333/193 |
| 2-202710 | 8/1990 | Japan . | |
| 3-34715 A | 2/1991 | Japan ...................................... | 333/195 |
| 5-55872 | 3/1993 | Japan . | |
| 7-38369 | 2/1995 | Japan . | |

OTHER PUBLICATIONS

A translated copy of the International Search Report for corresponding International Application No. PCT/JP96/00691, Jun. 10, 1996.

Primary Examiner—Robert Pascal
Assistant Examiner—Barbara Summons
Attorney, Agent, or Firm—Dickstein Shapiro Morin & Oshinsky LLP

[57] ABSTRACT

A surface acoustic wave filter comprises a first electrode structure array which is formed on the piezoelectric substrate, and includes an input/output IDT, two receipt IDTs formed outside the input/output IDT and two reflectors formed outside the two receipt IDTs, and a second electrode structure array which is formed on the piezoelectric substrate and includes an input/output IDT, two receipt IDTs formed outside the input/output IDT and two reflectors formed outside the two receipt IDTs, which are concatenated with each other. In a case that the surface acoustic wave filter is represented by a symmetrical lattice-type circuit which is expressed by a serial arm impedance and a parallel arm impedance and is electrically equivalent to the same, at least two resonances of the serial arm impedance and at least three resonances of the parallel arm impedance are used to form a passband. The surface acoustic wave filter can have wide bands and low spurious signal.

15 Claims, 6 Drawing Sheets

CONCATENATION PLANE

GAP L BETWEEN INPUT/OUTPUT IDT AND RECEIPT IDT 5,877,661

SURFACE ACOUSTIC WAVE FILTER WITH OPTIMALLY SIZED GAPS BETWEEN TRANSDUCERS

TECHNICAL FIELD

The present invention relates to a surface acoustic wave (SAW) filter to be used in mobile communication, etc.

BACKGROUND ART

Presently surface acoustic wave (SAW) filters are widely used in instruments of mobile communication, etc. because they have the advantages of small size, light weight, and no adjustment requirement, as well as other advantages. For mobile communication which requires characteristics, such as low propagation losses and high attenuation, SAW resonator filters are suitable.

A SAW resonator filter includes an input interdigital transducer (input IDT), an output interdigital transducer (output IDT), and a reflector. The SAW resonator filter uses resonance phenomena of surface acoustic waves confined in the transducer structure including the input IDT, the output IDT, and the reflector to have a passband of a frequency range which satisfies resonance conditions. A bandwidth of the SAW resonator filter is proportional to an electromechanical coupling coefficient ($k^2$) of the piezoelectric substrate.

The SAW resonator filters using one resonance can only have narrow bandwidths. In order for a SAW resonator filter to have a wide bandwidth, it is effective to couple a plurality of resonances so that the SAW resonator filter has a wider bandwidth than that using one resonance.

For example, standing waves of acoustic surface waves confined by the IDTs and the reflector can have a wider bandwidth by coupling two resonances (so-called the zeroth mode resonance and the first mode resonance) than by the use of one resonance. A SAW resonator filter including three IDTs to couple the zero-order mode and the secondary mode resonances is also effective.

On the other hand, to realize a SAW resonator filter having high attenuation, it is effective to concatenate two electrode structure arrays.

FIG. 1 shows one example of the SAW resonator filter including concatenated two electrode structure arrays.

A first electrode structure array is disposed on a piezoelectric substrate. The first electrode structure comprises an input/output IDT 1 having N1 pairs of electrodes, and receipt IDTs 2, 2' disposed outside the input/output IDT 1 and having N2 pairs of electrodes which are substantially the same pitch as the input/output IDT and, and reflectors 3, 3' disposed outside the receipt IDTs 2, 2'. The input/output IDT 1 and the receipt IDTs 2, 2' are arranged with the adjacent electrodes spaced from each other by a gap L between the centers thereof.

A second electrode structure array is disposed on the piezoelectric substrate. The second electrode structure comprises an input/output IDT 11 having N1 pairs of electrodes and disposed on the piezoelectric substrate, receipt IDTs 12, 12' disposed outside the input/output IDT 11 and having N2 pairs of electrodes which are substantially the same pitch as the input/output IDT 11, and reflectors 13, 13' disposed outside the receipt IDTs 12, 12'. The input/output IDT 11, and the receipt IDTs 12, 12' are arranged with the adjacent electrodes spaced from each other by a gap L between the centers thereof.

The receipt IDTs 2, 2' of the first electrode structure array, and the receipt IDTs 12, 12' of the second electrode structure array are connected respectively by lines 4, 4' to concatenate the first and the second electrode structure arrays. The lines 4, 4' are connected with each other by a line 5 and have the same potential. The line 5 is provided as required.

Input signals are inputted to the input/output IDT 1 of the first electrode structure array in the first stage. Acoustic surface waves excited by the input/output IDT 1 are multi-reflected and received by the receipt IDTs 2, 2'. Energy of the received surface acoustic waves is converted to electric signals by the receipt IDTs 2, 2' and is supplied to the second electrode structure array on the second stage by the line 4, 4'.

In the second electrode structure array in the second stage, the surface acoustic waves are excited by the receipt IDTs 12, 12' and received by the input/output IDT 11. Energy of the received acoustic surface waves is converted to electric signals by the input/output IDT 11 and outputted.

The SAW resonator filter including the thus concatenated two electrode structure arrays is a filter circuit having the symmetrical structure with respect to the concatenation plane as a reflection plane. It is known that such a filter circuit is represented by a symmetrical lattice-type circuit having a serial arm impedance Za and a parallel arm impedance Zb, as shown in FIG. 2.

In the symmetrical lattice-type circuit of FIG. 2, when absolute values |Za|, |Zb| of the serial arm impedance Za and the parallel arm impedance Zb are local minimum, the SAW resonator filter has resonance as one system. When absolute values |Za|, |Zb| of the serial arm impedance Za and the parallel arm impedance Zb are local maximum, the SAW resonator filter has antiresonance as one system. Standing waves corresponding to the antiresonance are present in the SAW resonator filter.

Here, adjustment to match a resonance frequency of the serial arm impedance Za with an antiresonance frequency of the parallel arm impedance Zb and match a resonance frequency of the parallel arm impedance Zb with an antiresonance frequency of the serial arm impedance Za is made to obtain good filter characteristics.

Prior art relating to a SAW resonator filter which has a widened bandwidth as a result of such method is described below.

Japanese Patent Laid-Open Publication No. Hei 06-85605/1994 discloses a surface acoustic wave filter which is suitable to widen bandwidths. This surface acoustic wave filter is intended to realize wide bandwidths by using a two-IDT structure in a triple mode. When an outside-band spurious signal is high, this acoustic surface wave filter, which has the two-IDT structure, cannot effectively reduce the spurious signal by adjusting pair numbers of the IDTs.

Japanese Patent Laid-Open Publication No. Sho 64-82706/1989 discloses an acoustic surface wave filter having a narrow bandwidth and large attenuation outside the band. This acoustic surface wave filter matches a peak of internal reflection with a peak of reflected waves between digital electrodes to thereby obtain a double mode. This acoustic surface wave filter, which is a double-mode acoustic surface wave filter, has failed to realize sufficient propagation loss reduction and wide bands.

Japanese Patent Laid-Open Publication No. Hei 05-315886/1993 discloses an acoustic surface wave filter having small ripples and large outside-band attenuation. This acoustic surface wave filter is intended to secure small ripples and wide passband widths by using a piezoelectric substrate having an above 10% electromechanical coupling coefficient, and differing an interdigital electrode number of an input interdigital transducer and that of an output interdigital transducer. In Japanese Patent Laid-Open Publication No. Hei 05-315886/1993, a 41°-rotated Y-cut X-propagating lithium niobate substrate having an above 10% electromechanical coupling coefficient is used, as the piezoelectric substrate. When an above 40° and below 45°-rotated X-cut Z-propagating lithium tetraborate substrate having a 1% electromechanical coupling coefficient, for example, is used as the piezoelectric, a specific passband width is only about 0.003, based on FIG. 9 of the specification of Japanese Patent Laid-Open Publication No. Hei 05-315886/1993, thus sufficiently wide bands cannot be realized.

Japanese Patent Laid-Open Publication No. Hei 05-267990/1993 discloses a surface acoustic wave filter having wide bandwidths and small propagation losses in high frequency regions. Japanese Patent Laid-Open Publication No. Hei 05-267990/1993 is intended to realize a surface acoustic wave filter of concatenated double mode surface acoustic wave filter having wide specific bands in high frequency regions. The acoustic surface wave filter, which is a double mode acoustic surface wave filter, has limitations regarding propagation loss reduction and widening bands.

Japanese Patent Laid-Open Publication No. Hei 07-38369/1995 discloses a multi-interdigital transducer-type acoustic surface wave filter having large passband widths and large attenuation amounts. Japanese Patent Laid-Open Publication No. Hei 07-38369/1995 is intended to realize an acoustic surface wave filter using three or more IDTs and defining a pitch between the IDTs. However, based on the study of Japanese Patent Laid-Open Publication No. Hei 07-38369/1995 by the inventors of the present application, the range defined by Japanese Patent Laid-Open Publication No. Hei 07-38369/1995 includes the double mode and modes larger than the double mode, and even a $4 \leq n \leq 6$ range where preferable propagation characteristics are available includes the double mode and larger modes than the double mode. Accordingly band widening technique based on the operation mode is not disclosed.

Japanese Patent Laid-Open Publication No. Hei 01-231417/1989 and Japanese Patent Laid-Open Publication No. Hei 02-202710/1990 also disclose acoustic surface wave filters having wide passband characteristics by the use of the double mode resonance. These acoustic surface wave filters, which are double mode acoustic surface wave filters, have limitations regarding propagation loss reduction and band widening.

As described above, acoustic surface wave filters having low propagation losses and wide bandwidths have been conventionally intended, but no acoustic surface wave filter having a sufficiently large passband width and sufficiently large outside-band attenuation amounts has been realized.

On the other hand, the bandwidth of a SAW resonator filter depends on the electromechanical coupling coefficient ($k^2$) of the piezoelectric substrate. The recent rapid development of the mobile communication requires SAW filters having bandwidths suitable for used bandwidths and low propagation losses. Piezoelectric substrates of quartz, $LiNbO_3$, $LiTaO_3$, or others are used depending on used bandwidths.

The piezoelectric substrates are usually classified in to those having large electromechanical coefficients $k^2$ and large frequency deflections with respect to temperature, and in to those having small electromechanical coefficients $k^2$ and small frequency deflections with respect to temperature.

The latter piezoelectric substrates having small electromechanical coefficients $k^2$ and small frequency deflections with respect to temperature are suitable for narrow band-uses, such as IF filters, etc. and will have significant practical merits if they can have wide bands.

The former piezoelectric substrates having large electromechanical coefficients $k^2$ and large frequency deflections with respect to temperature are suitable for applications requiring wide band characteristics, such as front ends, etc. and will have significant practical merits of increase of numbers of pass channels, etc. if they can have wider bands.

As described above, if the conventional acoustic surface wave filters can further widen bands, they will be able to find more applications while using merits of the respective piezoelectric substrates.

However, the conventional acoustic surface wave filters, especially the SAW resonator filters can not have bandwidths which are wide enough to enjoy the merits of the respective piezoelectric substrates.

An object of the present invention is to provide an acoustic surface wave filter whose band width is wider than that of the conventional acoustic surface wave filters, and in addition, has further improved outside-band spurious signal.

DISCLOSURE OF THE INVENTION

The inventors of the present invention noted, in a SAW resonator filter which comprises concatenated electrode structure arrays each comprising a plurality of IDTs and reflectors outside the IDTs, a gap between the input IDTs and the receipt IDTs, and found that the gap between the IDTs is optimized to excite and combine three resonances of serial arm impedance and a parallel arm impedance which express the SAW resonator filter in a symmetrical lattice-type circuit, whereby the SAW resonator filter can have wider bands and lower spurious signal than the conventional SAW resonator filters.

The surface acoustic wave filter according to one aspect of the present invention comprises a piezoelectric substrate; a first electrode structure array formed on the piezoelectric substrate and including an input/output IDT, two receipt IDTs formed outside the input/output IDT and two reflectors formed outside the two receipt IDTs; a second electrode structure array which is formed on the piezoelectric substrate and includes an input/output IDT, two receipt IDTs formed outside the input/output IDT and two reflectors formed outside the two receipt IDTs, and which is concatenated with the first electrode structure array, when the surface acoustic wave filter is represented by a symmetrical lattice-type circuit which is expressed by a serial arm impedance and a parallel arm impedance and is electrically equivalent to the same, at least two resonances of the serial arm impedance, at least three resonances of the parallel arm impedance being used to form a passband.

When the surface acoustic wave filter according to another aspect of the present invention is represented by a symmetrical lattice-type circuit which is expressed by a serial arm impedance and a parallel arm impedance and is electrically equivalent to the same, at least three resonances of the serial arm impedance, at least two resonances of the parallel arm impedance are used to form a passband.

When the surface acoustic wave filter according to yet another aspect of the present invention is represented by a symmetrical lattice-type circuit which is expressed by a serial arm impedance and a parallel arm impedance and is electrically equivalent to the same, at least three resonances of the serial arm impedance, at least three resonances of the parallel arm impedance are used to form a passband.

The surface acoustic wave filter according to yet another aspect of the present invention has a gap L between the input/output IDT and the receipt IDTs each in the first electrode structure array and the second electrode structure array satisfying the following formula $$(n/2-0.010)\lambda \leq L \leq (n/2-0.025)\lambda$$

wherein λ represents a wavelength of surface acoustic waves, and n represents a natural number.

In the above-described surface acoustic wave filter, it is preferable that a natural number n for determining said gap L is equal to or less than 5.

In the above-described surface acoustic wave filter, it is preferable that the piezoelectric substrate is lithium tetraborate.

In the above-described surface acoustic wave filter, it is preferable that the piezoelectric substrate is an above 40° and below 45°-rotated X-cut and Z-propagating lithium tetraborate.

BEST MODES FOR CARRYING OUT THE INVENTION

The SAW resonator filter according to a first embodiment of the present invention will be explained with reference to FIGS. 1 to 4.

Figure 1:
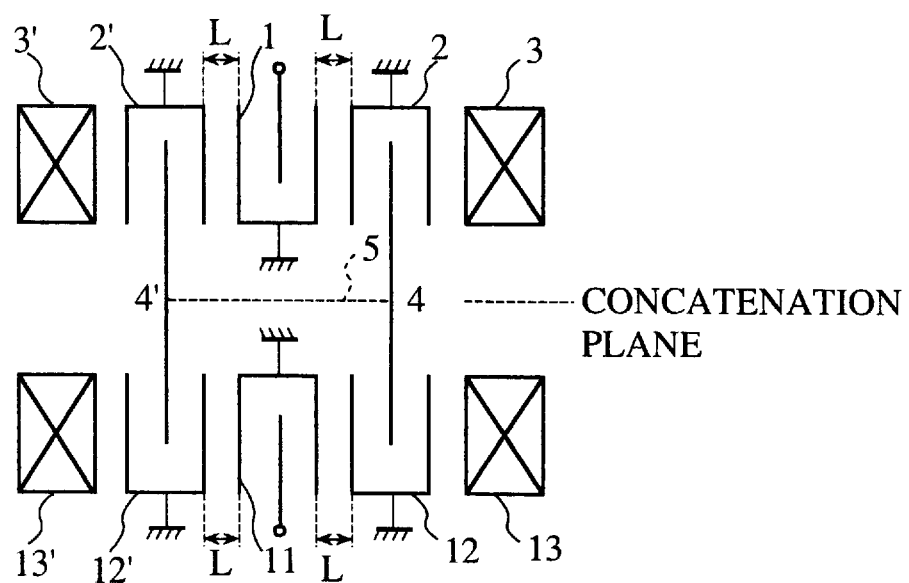
FIG. 1 is a view of one example of the SAW resonator filter comprising two concatenated electrode structure arrays.
Figure 2:
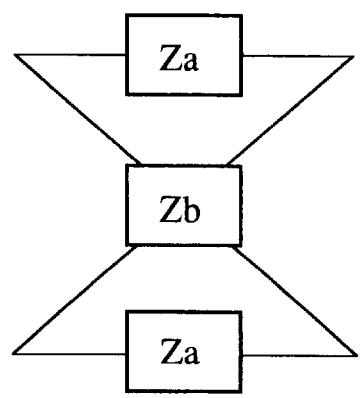
FIG. 2 is a view of a symmetrical lattice-type circuit which is an equivalent circuit to the SAW resonator filter comprising two concatenated electrode structure arrays.

The present embodiment uses as a model a SAW resonator filter having two electrode structure arrays concatenated as shown in FIG. 1 to simulate a serial arm impedance Za and a parallel arm impedance Zb of a symmetrical lattice-type circuit shown in FIG. 2 which is an electric equivalent.

Minimum values of absolute values |Za| of the serial arm impedance Za and of absolute values |Zb| of the parallel arm impedance Zb are resonance of the SAW resonator filter, and maximum values of the absolute values |Za| of the serial arm impedance Za and of absolute values |Zb| of the parallel arm impedance Zb are antiresonance of the SAW resonator filter. Numbers of the SAW resonances generated in the SAW resonator filter can be seen based on numbers of the minimum and maximum values.

Figure 3:
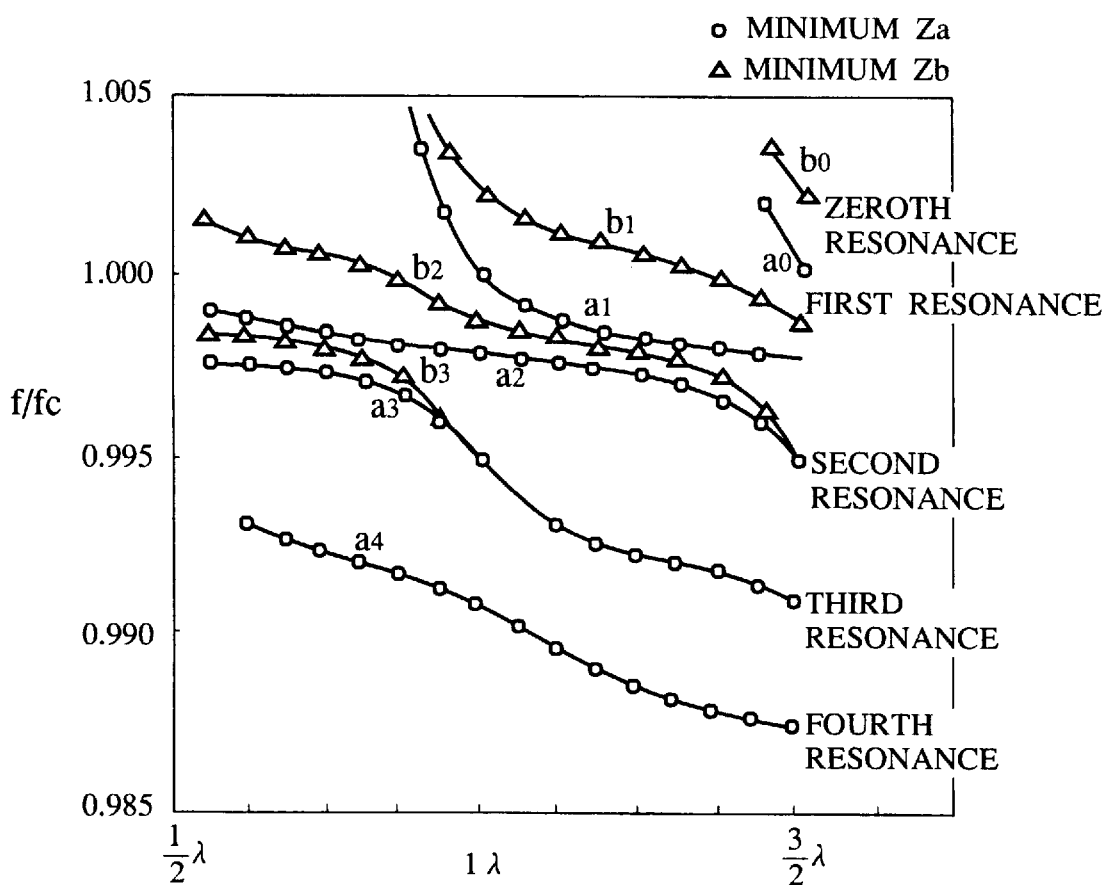
FIG. 3 is a graph of minimum values of absolute values |Za|, |Zb| of a gap L between the input/output IDTs and the receipt IDTs.

FIG. 3 shows changes of minimum values of absolute values |Za|, |Zb| with respect to gaps L between input/output IDTs 1, 11 and receipt IDTS 2, 2', 12, 12' of the SAW resonator filter including the input/output IDTs 1, 11 having 56 pairs of electrodes, the receipt IDTs 2, 2', 12, 12' having 42 pairs of electrodes, and reflectors 3, 3', 13, 13' having 80 electrodes. A pitch of the electrodes is about 3.6 μm (=λ), and an electrode width of the respective electrodes is about 0.9 μm (=λ/4).

A pitch of the electrodes of the IDTs represents a distance between each electrode of the IDTs of the same pair and one which is immediately next thereto, and is usually a distance between the centers of the electrodes. A gap L between the input/output IDTs 1, 11, and the receipt IDTs 2, 2', 12, 12' is a distance between the centers of one of the electrodes of the input/output IDTs, and one of the electrodes of the receipt IDTs which are adjacent to each other in the direction of propagation of acoustic surface waves.

In FIG. 3, a gap L between the input/output IDTs 1, 11, and the receipt IDTs 2, 2', 12, 12' is represented by the horizontal axis, and normalized frequencies (f/fc) by a center frequency (fc) are represented by the vertical axis. In FIG. 3, the points indicate frequencies at points of minimum values of Za, Zb.

The points of minimum values of Za, Zb are represented in the order of high to low frequencies by a0, a1, a2, a3, . . . ; b0, b1, b2, b3, . . . . These points of minimum values indicate resonance and respectively correspond to a zeroth resonance, a first resonance, a second resonance, a third resonance, . . . .

The conventional SAW resonator filters use double mode resonance, which uses two of these resonances to form a band. In a case that a gap L between the input/output IDTs and the receipt IDTs is near λ, the first and the second resonances are used.

By making smaller a gap L between the input/output IDTs 1, 11 and the receipt IDTs 2, 2', 12, 12' than the conventional value L=nλ/2 (n=1, 2, 3, . . . : natural numbers), the third resonance which has been on the side of lower frequencies shifts to the side of higher frequencies, and the first resonance also increases in frequencies.

Here a gap L between the input/output IDTs 1, 11, and the receipt IDTs 2, 2', 12, 12' is made to be in the range $$(1-0.1)\lambda \leq L \leq (1-0.025)\lambda,$$

that is, $$0.9\lambda \leq L \leq 0.975\lambda,$$

whereby the first resonance, the second resonance and the third resonance (a1, a2, a3, b1, b2, b3 in FIG. 3) come nearer to each other and can form one large band.

In a case that a gap L between the input/output IDTs and the receipt IDTs is smaller than 0.9 λ, unpreferably the first resonance is too far shifted to the high-frequency side to form the band. In a case that a gap L between the input/ output IDTs and the receipt IDTs is larger than 0.975 λ, unpreferably the third resonance is shifted to the low-frequency side to generate spurious signal.

The serial arm impedance Za and the parallel arm impedance Zb change periodically by half a wavelength with respect to a gap L between the input/output IDTs and the receipt IDTs. Accordingly, a value of the gap L between the input/output IDTs and the receipt IDTs can be different from integral times a half wavelength with respect to from 0.9 to 0.975 λ.

A difference of half a wavelength difference in the gap L shifts the resonances forming the passband. For example, in a range of L=1.4 to 1.475 λ, the resonances at the points a0, a1, a2, b0, b1, b2 in FIG. 3 can form the band.

Accordingly, a value of the gap L between the input/output IDTs and the receipt IDTs is given by the following formula $$(n/2-0.10)\lambda \leq L \leq (n/2-0.025)\lambda \text{ (n: natural number)},$$

whereby as shown in FIG. 3, at least three resonances of the serial arm impedance Za and two resonances of the parallel arm impedance Zb, or at least two resonances of the serial arm impedance Za and three resonances of the parallel arm impedance Zb are used to obtain wider band characteristics than the conventional IDT filters.

Figure 4:
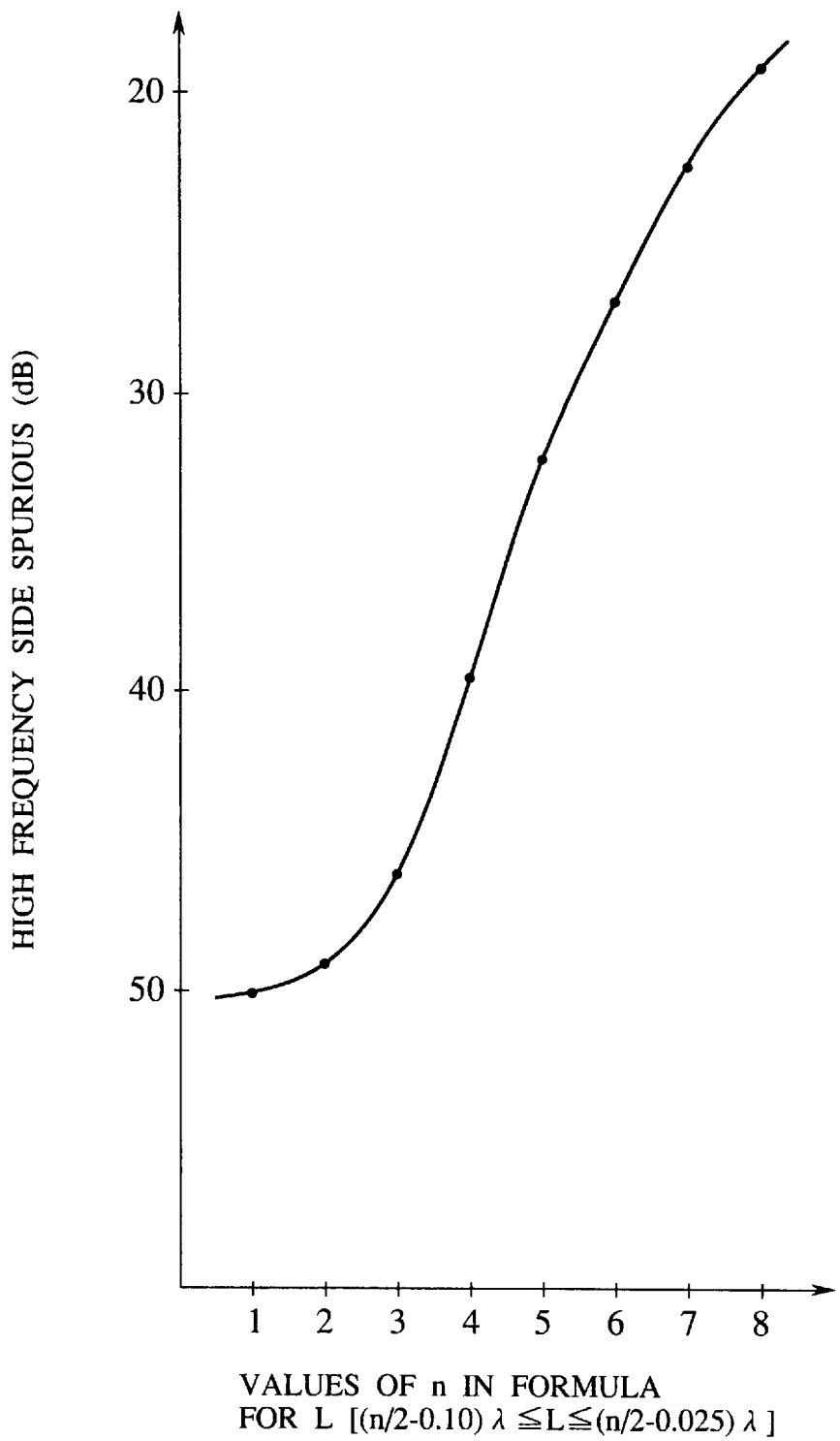
FIG. 4 is a graph of spurious levels on the high frequency side for a natural number n in the formula on the gap L between the input/output IDTs and the receipt IDTs.

FIG. 4 shows a graph of changes in spurious signal on the high frequency side in a case that n in the above-described formula for the gap L is changed in the SAW resonator filter including the input/output IDTs 1, 11 having 58 pairs of electrodes, the receipt IDTs 2, 2', 2, 12' having 42 pairs of electrodes, and the reflectors 3, 3', 13, 13' having 80 electrodes. A pitch of the interdigital transducers is about 3.6 μm (=λ), and a width of the respective electrodes of the interdigital transducers is about 0.9 μm (=λ/4). When n is increased, spurious signal on the high frequency side has a higher level. When n is 1 or 2, a spurious signal level is only about 50 dB, but is abruptly degraded as n is increased to 3 and to 4. Until n is increased to 5, a spurious level is above 30 dB, but when n is equal to or more than 6, the spurious level is unpreferably below 30 dB.

Accordingly, it is basically preferred that n=1 (a gap L is near λ/2). When n=1 (a gap L is near λ/2), however, a gap between the input/output IDTs and the receipt IDTs is made smaller than a pitch of the input/output IDTs and of the receipt IDTs. An electrode width of the input/output IDTs and the receipt IDTs must be made smaller than 1 μm, which makes it impossible to form the circuit in the SAW filter which is operative at a high frequency band (e.g., a 900 MHz band). Therefore, it is preferable that n=2 (a gap L is near λ).

All the first, the second and the third resonances are used to widen passbands, but flatness in the passbands sometimes deteriorates. In a case that flatness in a passband is more important than band widening, aperture lengths, etc. are adjusted, whereby a terminal impedance is brought near to two adjacent resonances of the serial arm impedance Za and of the parallel arm impedance Zb on the high frequency side or the low frequency side to improve the flatness.

It is considered that standing waves excited corresponding to the three resonances of the serial arm impedance Za and the parallel arm impedance Zb are all the even-order standing waves because the electrode structure arrays are symmetrical to the input/output IDTs.

EXAMPLE 1

The SAW resonance filter having a 900 MHz band shown in FIG. 1 was fabricated. As the piezoelectric substrate, a 45°-rotated X-cut Z-propagating $Li_2B_4O_7$ (lithium tetraborate) substrate was used, and the input/output IDTs 1, 11 having 56 pairs of electrodes, and the receipt IDTs 2, 2', 12, 12' having 42 pairs of electrodes, and the reflectors 3, 3', 13, 13' having 80 electrodes were provided. A pitch of the electrodes was about 3.6 μm (=λ), and a width of the electrodes was about 0.9 μm (=λ/4). A gap L between the input/output IDTs 1, 11 and the receipt IDTs 2, 2', 12, 12' was 0.93 λ (n=2). A gap between the receipt IDTs 2, 2', 12, 12' and the reflectors 3, 3', 13, 13' was 0.93 λ. A pitch of the reflectors 3, 3', 13, 13' was about 1.01 λ. A normalized film thickness (or electrode film thickness normalized by wavelength) of the electrodes was about 2%. Generation of transverse waves was suppressed by apodizing the input/output IDTs 1, 11 and the receipt IDTs 2, 2', 12, 12', and an effective aperture length was set at about 350 μm so that a terminal impedance was 50 Ω.

Figure 5:
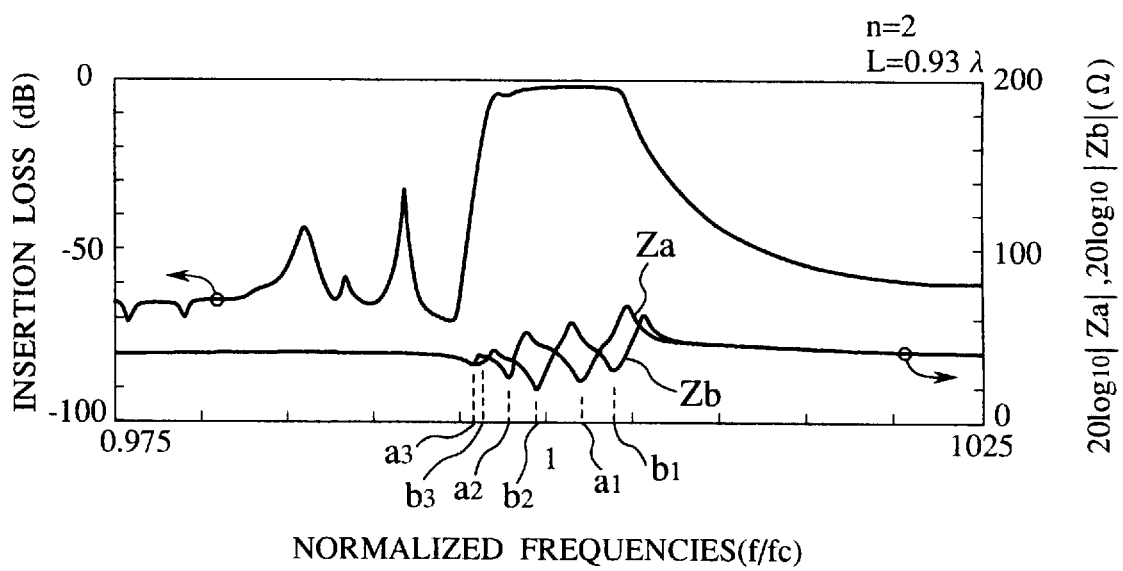
FIG. 5 is a graph of frequency characteristics of insertion losses of the SAW resonator filter according to Example 1 and frequency characteristics of |Za| and |Zb| in a simulation.

FIG. 5 shows frequency characteristics of insertion losses of the SAW resonator filter of Example 1, and frequency characteristics of the serial arm impedance |Za| and the parallel arm impedance |Zb| in the simulation. In FIG. 5, points of minimum values of the serial arm impedance Za and minimum values of parallel arm impedance Zb are indicated by a1, a2, . . . ; b1, b2, . . . , respectively.

A specific bandwidth of Example 1 was about 0.7% and was about 1.5 times that of Control 1 which will be described later. Here, a specific bandwidth is given by normalizing a passband width at a –3 dB insertion loss by a center frequency. As apparent in FIG. 5, the SAW resonator filter of Example 1 forms the passband by using three resonances a1, a2 and a3 of the serial arm impedance Za, and three resonances b1, b2 and b3 of the parallel arm impedance Zb. Although not shown in FIG. 5, spurious signal on the high frequency side of the passband was present, and the spurious signal level was about 50 dB.

(Control 1)

The SAW resonator filter having a 900 MHz band shown in FIG. 1 was fabricated. As the piezoelectric substrate, a 45°-rotated X-cut Z-propagating $Li_2B_4O_7$ substrate was used, and the input/output IDTs 1, 11 having 38 pairs of electrodes, and the receipt IDTs 2, 2', 12, 12' having 34 pairs of electrodes, and the reflectors 3, 3', 13, 13' having 80 electrodes were provided. A pitch of the electrodes was about 3.6 μm (=λ), and a width of the electrodes was about 0.9 μm (=λ/4). A gap L between the input/output IDTs 1, 11 and the receipt IDTs 2, 2', 12, 12' was 1.00 λ. A gap between the receipt IDTs 2, 2', 12, 12' and the reflectors 3, 3', 13, 13' was about 1.00 λ. A pitch of the reflectors 3, 3', 13, 13' was about 1.01 λ. A normalized film thickness (electrode film thickness normalized by wavelength) of the electrodes was about 2%. Generation of transverse waves was suppressed by apodizing the input/output IDTs 1, 11 and the receipt IDTs 2, 2', 12, 12', and an effective aperture length was set at about 400 μm so that a terminal impedance is 50 Ω.

Control 1 and Example 1 have the different numbers of pairs of electrodes of the input/output IDTs 1, 11 and the receipt IDTs 2, 2', 12, 12' from each other. This is because, when a gap L between the input/output IDTs and the receipt IDTs is changed, the serial arm impedance Za and the parallel arm impedance Zb have different frequency positions. Accordingly, their optimum numbers of pairs are different.

Figure 6:
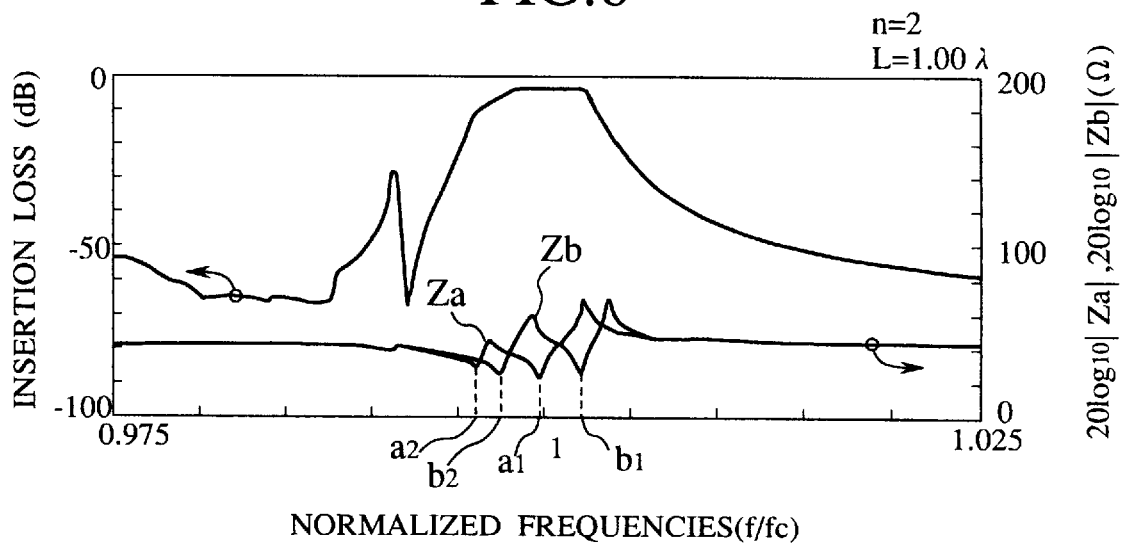
FIG. 6 is a graph of frequency characteristics of insertion losses of the SAW resonator filter according to Control 1 and frequency characteristics of |Za| and |Zb| in the simulation.

FIG. 6 shows frequency characteristics of insertion losses of the SAW resonator filter of Control 1, and frequency characteristics of the serial arm impedance |Za| and the parallel arm impedance |Zb| in the simulation. In FIG. 6, points of minimum values of the serial arm impedance Za and the parallel arm impedance Zb are indicated by a1, a2, . . . ; b1, b2, . . . , respectively.

A specific bandwidth of Control 1 was about 0.5%, which is narrower than that of Example 1. As apparent in FIG. 6, the SAW resonator filter of Control 1 forms the passband by using two resonances a1 and a2 of the serial arm impedance Za, and two resonances b1 and b2 of the parallel arm impedance Zb. Although not shown in FIG. 6, spurious signal on the high frequency side of the passband was present, and the spurious signal level was about 35 dB, which is inferior to that of Example 1.

EXAMPLE 2

The SAW resonator filter having a 900 MHz band shown in FIG. 1 was fabricated. As the piezoelectric substrate, a 45°-rotated X-cut Z-propagating $Li_2B_4O_7$ substrate was used, and the input/output IDTs 1, 11 having 58 pairs of electrodes, and the receipt IDTs 2, 2', 12, 12' having 42 pairs of electrodes, and the reflectors 3, 3', 13, 13' having 80 electrodes were provided. A pitch of the electrodes was about 3.6 μm (=λ), and a width of the electrodes was about 0.9 μm (=λ/4). A gap L between the input/output IDTs 1, 11 and the receipt IDTs 2, 2', 12, 12' was 0.93 λ (n=2). A gap between the receipt IDTs 2, 2', 12, 12' and the reflectors 3, 3', 13, 13' was 0.93 λ. A pitch of the reflectors 3, 3', 13, 13' was about 1.01 λ. A normalized film thickness (electrode film thickness normalized by wavelength) of the electrodes was about 2%. Generation of transverse waves was suppressed by apodizing the input/output IDTs 1, 11 and the receipt IDTs 2, 2', 12, 12', and an effective aperture length was set at about 350 μm so that a terminal impedance was 50 Ω.

Figure 7:
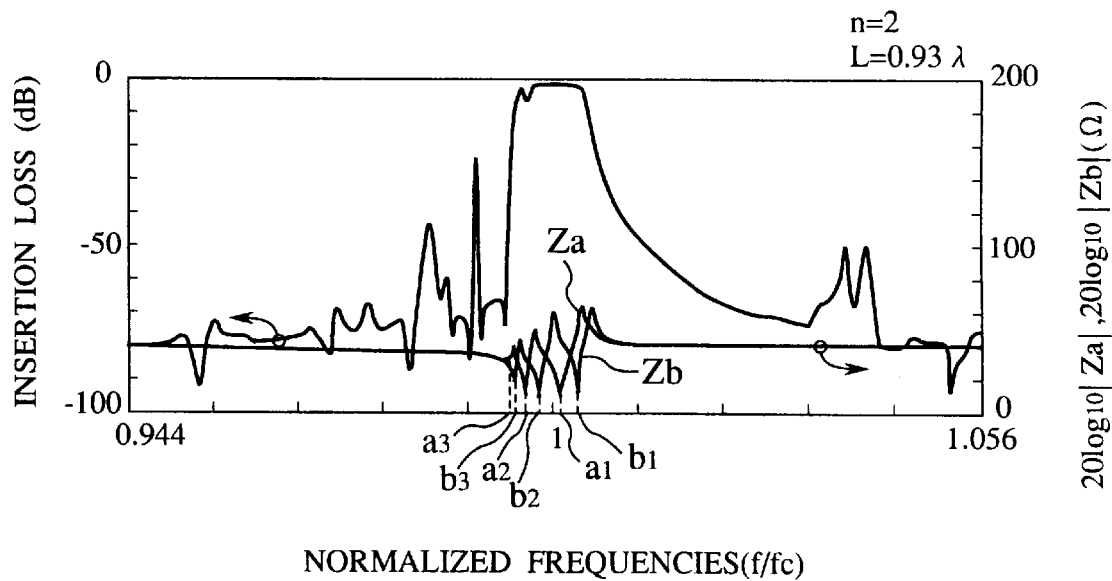
FIG. 7 is a graph of frequency characteristics of insertion losses of the SAW resonator filter according to Example 2 and frequency characteristics of |Za| and |Zb| in the simulation.

FIG. 7 shows frequency characteristics of insertion losses of the SAW resonator filter of Example 2, and frequency characteristics of the serial arm impedance |Za| and the parallel arm impedance |Zb| in the simulation. In FIG. 7 points of minimum values of the serial arm impedance Za and minimum values of the parallel arm impedance Zb are indicated by a1, a2, . . . , b1, b2, . . . , respectively.

A specific bandwidth of Example 2 was about 0.7% and was about 1.4 times that of Control 2 which will be described later. As apparent in FIG. 7, the SAW resonator filter of Example 2 forms the passband by using three resonances a1, a2 and a3 of the serial arm impedance Za, and three resonances b1, b2 and b3 of the parallel arm impedance Zb. Spurious signal on the high frequency side of the passband was present, and the spurious signal level was about 50 dB.

EXAMPLE 3

The SAW resonance filter having a 900 MHz band shown in FIG. 1 was fabricated. As the piezoelectric substrate, a 45°-rotated X-cut Z-propagating $Li_2B_4O_7$ substrate was used, and the input/output IDTs 1, 11 having 58 pairs of electrodes, and the receipt IDTs 2, 2', 12, 12' having 42 pairs of electrodes, and the reflectors 3, 3', 13, 13' having 80 electrodes were provided. A pitch of the electrodes was about 3.6 μm (=λ), and a width of the electrodes was about 0.9 μm (=λ/4). A gap L between the input/output IDTs 1, 11 and the receipt IDTs 2, 2', 12, 12' was 3.93 λ (n=8). A gap between the receipt IDTs 2, 2', 12, 12' and the reflectors 3, 3', 13, 13' was 3.93 λ. A pitch of the reflectors 3, 3', 13, 13' was about 1.01 λ. A normalized film thickness (electrode film thickness/wavelength) of the electrodes was about 2%. Generation of transverse waves was suppressed by apodizing the input/output IDTs 1, 11 and the receipt IDTs 2, 2', 12, 12', and an effective aperture length was set at about 350 μm so that a terminal impedance was 50 Ω.

Figure 8:
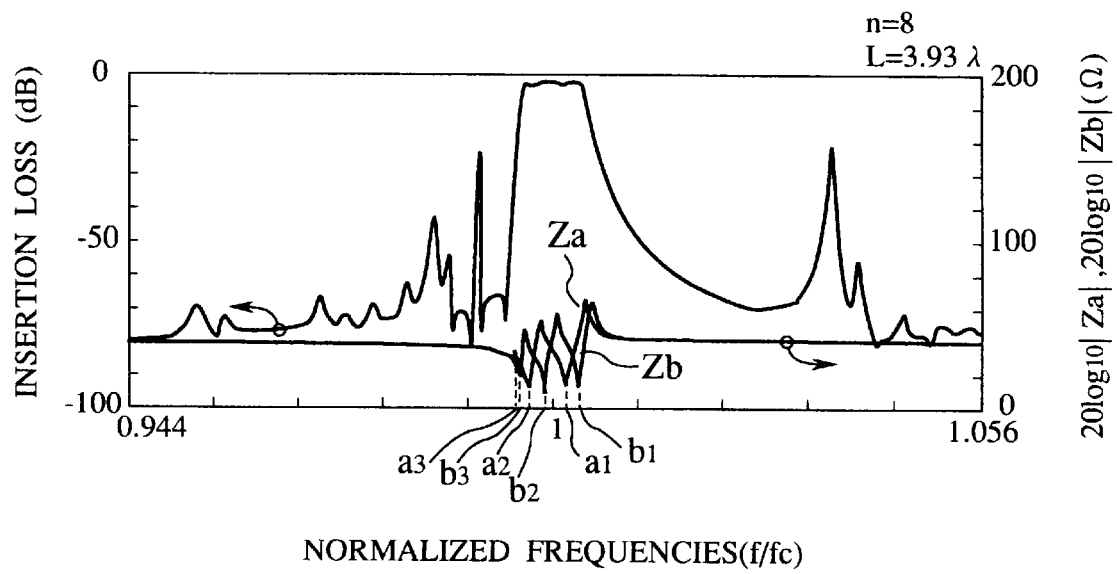
FIG. 8 is a graph of frequency characteristics of insertion losses of the SAW resonator filter according to Example 3 and frequency characteristics of |Za| and |Zb| in the simulation.

FIG. 8 shows frequency characteristics of insertion losses of the SAW resonator filter of Example 3, and frequency characteristics of the serial arm impedance |Za| and the parallel arm impedance |Zb| in the simulation. In FIG. 8 points of minimum values of the serial arm impedance Za and minimum values of the parallel arm impedance Zb are indicated by a1, a2, . . . , b1, b2, . . . , respectively.

A specific bandwidth of Example 3 was about 0.7% and was about 1.4 times that of Control 2 which will be described later. As apparent in FIG. 8, the SAW resonator filter of Example 3 forms the passband by using three resonances a1, a2 and a3 of the serial arm impedance Za, and three resonances b1, b2 and b3 of the parallel arm impedance Zb. Spurious signal on the high frequency side of the passband was present, and the spurious signal level was about 20 dB.

The SAW resonator filters were fabricated respectively with gaps L between the input/output IDTs 1, 11 and the receipt IDTs 2, 2', 12, 12' set at 1.43 λ (n=3), 1.93 λ(n=4), 2.43 λ (n=5), 2.93 λ (n=6) and 3.43 λ (n=7), and gaps between the receipt IDTs 2, 2', 12, 12' and the reflectors 3, 3', 13, 13' set at 1.43 λ, 1.93 λ, 2.43 λ, 2.93 and 3.43 λ, which are equal to the gaps L between the input/output IDTs 1, 11 and the receipt IDTs 2, 2', 12, 12'. These SAW resonator filters had the same other conditions as those of Examples 2 and 3.

Specific bandwidths were substantially constantly about 0.7% in a range from n=2 to n=8, which was about 1.4 times that of Control 2 which will be described later.

FIG. 4 shows n-dependence of the spurious signal levels of the spurious signal on the high frequency sides of the passbands. The spurious signal levels were about 50 dB for n=2, about 30 dB for n=5, about 20 dB for n=8. The spurious signal levels became inferior as n increased.

(Control 2)

The SAW resonance filter having a 900 MHz band shown in FIG. 1 was fabricated. As the piezoelectric substrate, a 45°-rotated X-cut Z-propagating $Li_2B_4O_7$ substrate was used, and the input/output IDTs 1, 11 having 34 pairs of electrodes, and the receipt IDTs 2, 2', 12, 12' having 80 pairs of electrodes, and the reflectors 3, 3', 13, 13' having 80 electrodes were provided. A pitch of the electrodes was about 3.6 μm (=λ), and a width of the electrodes was about 0.9 μm (=λ/4). A gap L between the input/output IDTs 1, 11 and the receipt IDTs 2, 21, 12, 12' was 1.00 λ. A gap between the receipt IDTs 2, 2', 12, 12' and the reflectors 3, 3', 13, 13' was 1.00 λ. A pitch of the reflectors 3, 3', 13, 13' was about 1.01 λ. A normalized film thickness (electrode film thickness normalized by wavelength) of the electrodes was about 2%. Generation of transverse waves was suppressed by apodizing the input/output IDTs 1, 11 and the receipt IDTs 2, 2', 12, 12', and an effective aperture length was set at about 400 μm so that a terminal impedance was 50 Ω.

Figure 9:
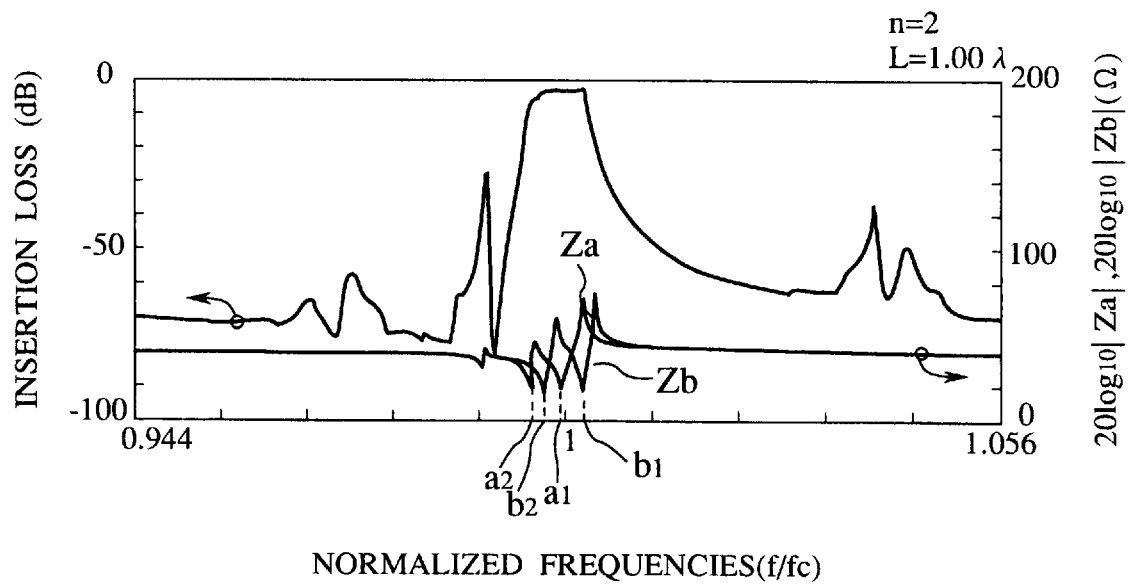
FIG. 9 is a graph of frequency characteristics of insertion losses of the SAW resonator filter according to Control 2 and frequency characteristics of |Za| and |Zb| in the simulation.

FIG. 9 shows frequency characteristics of insertion losses of the SAW resonator filter of Control 2, and frequency characteristics of the serial arm impedance |Za| and the parallel arm impedance |Zb| in the simulation. In FIG. 9 points of minimum values of the serial arm impedance Za and minimum values of the parallel arm impedance Zb are indicated by a1, a2, . . . , b1, b2, . . . , respectively.

A specific bandwidth of Control 2 was about 0.5%, which was narrower than the specific bandwidths of Examples 2 and 3. As apparent in FIG. 9, the SAW resonator filter of Control 2 forms the passband by using two resonances a1 and a2 of the serial arm impedance Za, and two resonances b1 and b2 of the parallel arm impedance Zb. Spurious signal on the high frequency side of the passband was present, and the spurious signal level was about 35 dB, which was inferior to the spurious signal levels of Examples 2 and 3.

EXAMPLE 4

The SAW resonance filter having a 900 MHz band shown in FIG. 1 was fabricated. As the piezoelectric substrate, a 45°-rotated X-cut Z-propagating $Li_2B_4O_7$ substrate was used, and the input/output IDTs 1, 11 having 66 pairs of electrodes, and the receipt IDTs 2, 2', 12, 12' having 50 pairs of electrodes, and the reflectors 3, 3', 13, 13' having 40 electrodes were provided. A pitch of the electrodes was about 8.4 μm ($=\lambda$), and a width of the electrodes was about 2.1 μm ($=\lambda/4$). A gap L between the input/output IDTs 1, 11 and the receipt IDTs 2, 2', 12, 12' was 0.413 $\lambda$ (n=1). A gap between the receipt IDTs 2, 2', 12, 12' and the reflectors 3, 3', 13, 13' was 0.413 $\lambda$. A pitch of the reflectors 3, 3', 13, 13' was about 1.006 $\lambda$. A normalized film thickness (electrode film thickness normalized by wavelength) of the electrodes was about 2%. Generation of transverse waves was suppressed by apodizing the input/output IDTs 1, 11 and the receipt IDTs 2, 2', 12, 12', and an effective aperture length was set at about 900 μm so that a terminal impedance was 50 Ω.

Figure 10:
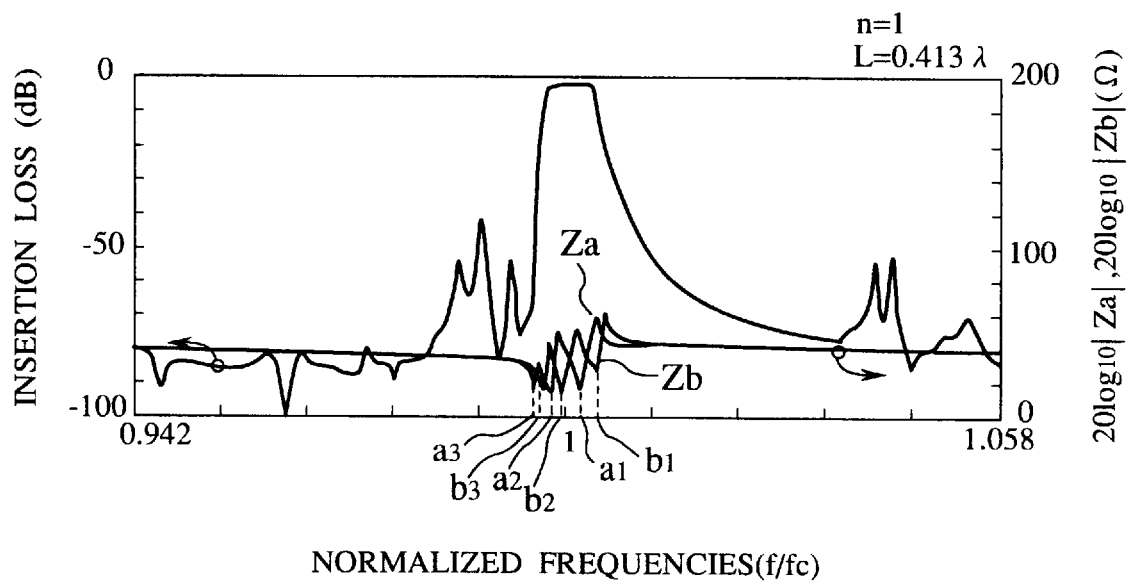
FIG. 10 is a graph of frequency characteristics of insertion losses of the SAW resonator filter according to Example 4 and frequency characteristics of |Za| and |Zb| in the simulation.

FIG. 10 shows frequency characteristics of insertion losses of the SAW resonator filter of Example 4, and frequency characteristics of the serial arm impedance |Za| and the parallel arm impedance |Zb| in the simulation. In FIG. 10 points of minimum values of the serial arm impedance Za and minimum values of the parallel arm impedance Zb are indicated by a1, a2, . . . , b1, b2, . . . , respectively.

A specific bandwidth of Example 4 was about 0.65%. As apparent in FIG. 10, the SAW resonator filter of Example 2 forms the passband by using three resonances a1, a2 and a3 of the serial arm impedance Za, and three resonances b1, b2 and b3 of the parallel arm impedance Zb. Spurious signal on the high frequency side of the passband was present, and the spurious signal level was about 50 dB.

EXAMPLE 5

The SAW resonance filters having a 900 MHz band shown in FIG. 1 were fabricated. As the piezoelectric substrates, a 45°-rotated X-cut Z-propagating $Li_2B_4O_7$ substrates were used, and the input/output IDTs 1, 11 having 66 pairs of electrodes, and the receipt IDTs 2, 2', 12, 12' having 50 pairs of electrodes, and the reflectors 3, 3', 13, 13' having 45 electrodes were provided. A pitch of the electrodes was about 8.4 μm ($=\lambda$), and a width of the electrodes was about 2.1 μm ($=\lambda/4$). A pitch of the reflectors 3, 3', 13, 13' was about 1.013 $\lambda$. A normalized film thickness (electrode film thickness normalized by wavelength) of the electrodes was about 2%.

Gaps L between the input/output IDTs 1, 11 and the receipt IDTs 2, 2', 12, 12' were variously set at 0.913 $\lambda$ (n=2), 1.413 $\lambda$ (n=3), 1.913 $\lambda$ (n=4), 2.413 $\lambda$ (n=5) and 2.913 $\lambda$ (n=6), 3.413 $\lambda$ (n=7), and 3.913 $\lambda$ (n=8), and gaps between the receipt IDTs 2, 2', 12, 12' and the reflectors 3, 3', 13, 13' were set at 0.913$\lambda$, 1.413$\lambda$, 1.913$\lambda$, 2.413 $\lambda$ and 2.913$\lambda$, 3.413$\lambda$, and 3.913 $\lambda$, which are equal to the gaps L between the input/output IDTs 1, 11 and the receipt IDTs 2, 2', 12, 12'.

Generation of transverse waves was suppressed by apodizing the input/output IDTs 1, 11 and the receipt IDTs 2, 2', 12, 12', and an effective aperture length was set at about 900 μm so that a terminal impedance was 50 Ω.

Specific bandwidths a little decreased in a range from n=2 to n=8, and an about 0.65% specific bandwidth for n=2 was decreased to about 0.62% for n=8, which was 95% thereof. Spurious signal levels of the spurious signals on the high frequency sides of the passbands were about 50 dB for n=2, about 30 dB for n=5 and about 20 dB for n=8. The spurious signal levels became inferior as n increased.

INDUSTRIAL APPLICABILITY

In the surface acoustic wave filter according to the present invention, when the surface acoustic filter is represented by a symmetrical lattice-type circuit which is expressed by a serial arm impedance and a parallel arm impedance and is electrically equivalent to the same, at least two resonances of the serial arm impedance and at least three resonances of the parallel arm impedance are used to form a passband, whereby the surface acoustic filter can have wider bands and lower spurious signal than the conventional surface acoustic wave filters. Such surface acoustic wave filter is suitable as a filter to be used in mobile communication, etc. which require low propagation losses, and large attenuation amount characteristics.

We claim:

1. A surface acoustic wave filter comprising:

a piezoelectric substrate;

a first electrode structure array which is formed on the piezoelectric substrate, and includes an input/output IDT, two receipt IDTs formed outside the input/output IDT and two reflectors formed outside the two receipt IDTs;

a second electrode structure array which is formed on the piezoelectric substrate, and includes an input/output IDT, two receipt IDTs formed outside the input/output IDT and two reflectors formed outside the two receipt IDTs, and which is concatenated with the first electrode structure array, the surface acoustic wave filter being represented by a symmetrical lattice-type circuit which is expressed by a serial arm impedance and a parallel arm impedance and is electrically equivalent to the same, a first gap in each of the electrode structure arrays formed between the input/output IDT and one of the two respective receipt IDTs, and a second gap in each of the electrode structure arrays formed between the input/output IDT and the other of the two respective receipt IDTs, each gap being formed so that at least two resonances of the serial arm impedance and at least three resonances of the parallel arm impedance are used to form a passband.

2. A surface acoustic wave filter according to claim 1, wherein the piezoelectric substrate is lithium tetraborate.

3. A surface acoustic wave filter according to claim 2, wherein the piezoelectric substrate is an above 40° and below 45°-rotated X-cut and Z-propagating lithium tetraborate.

4. A surface acoustic wave filter comprising:

a piezoelectric substrate;

a first electrode structure array which is formed on the piezoelectric substrate, and includes an input/output IDT, two receipt IDTs formed outside the input/output IDT and two reflectors formed outside the two receipt IDTs;

a second electrode structure array which is formed on the piezoelectric substrate, and includes an input/output IDT, two receipt IDTs formed outside the input/output IDT and two reflectors formed outside the two receipt IDTs, and which is concatenated with the first electrode structure array, the surface acoustic wave filter being represented by a symmetrical lattice-type circuit which is expressed by a serial arm impedance and a parallel arm impedance and is electrically equivalent to the same, a first gap in each of the electrode structure arrays formed between the input/output IDT and one of the two respective receipt IDTs, and a second gap in each of the electrode structure arrays formed between the input/output IDT and the other of the two respective receipt IDTs, each gap being formed so that at least three resonances of the serial arm impedance and at least three resonances of the parallel arm impedance are used to form a passband.

5. A surface acoustic wave filter according to claim 4, wherein the piezoelectric substrate is lithium tetraborate.

6. A surface acoustic wave filter according to claim 5, wherein the piezoelectric substrate is an above 40° and below 45°-rotated x-cut and z-propagating lithium tetraborate.

7. A surface acoustic wave filter comprising:

a piezoelectric substrate;

a first electrode structure array which is formed on the piezoelectric substrate, and includes an input/output IDT, two receipt IDTs formed outside the input/output IDT and two reflectors formed outside the two receipt IDTs;

a second electrode structure array which is formed on the piezoelectric substrate, and includes an input/output IDT, two receipt IDTs formed outside the input/output IDT and two reflectors formed outside the two receipt IDTs, and which is concatenated with the first electrode structure array, the surface acoustic wave filter being represented by a symmetrical lattice-type circuit which is expressed by a serial arm impedance and a parallel arm impedance and is electrically equivalent to the same, a first gap in each of the electrode structure arrays formed between the input/output IDT and one of the two respective receipt IDTs, and a second gap in each of the electrode structure arrays formed between the input/output IDT and the other of the two respective receipt IDTs, each gap being formed so that at least three resonances of the serial arm impedance and at least two resonances of the parallel arm impedance are used to form a passband.

8. A surface acoustic wave filter according to claim 7, wherein the piezoelectric substrate is lithium tetraborate.

9. A surface acoustic wave filter according to claim 8, wherein the piezoelectric substrate is an above 40° and below 45°-rotated x-cut and z-propagating lithium tetraborate.

10. A surface acoustic wave filter comprising:

a piezoelectric substrate;

a first electrode structure array which is formed on the piezoelectric substrate, and includes an input/output IDT, two receipt IDTs formed outside the input/output IDT and two reflectors formed outside the two receipt IDTs;

a second electrode structure array which is formed on the piezoelectric substrate, and includes an input/output IDT, two receipt IDTs formed outside the input/output IDT and two reflectors formed outside the two receipt IDTs, and which is concatenated with the first electrode structure array, a gap L between the input/output IDT and the receipt IDTs each in the first electrode structure array and the second electrode structure array satisfying the following formula $$(n/2-0.10)\lambda \leq L \leq (n/2-0.025)\lambda$$

wherein $\lambda$ represents a wavelength of surface acoustic waves, and n represents a natural number.

11. A surface acoustic wave filter according to claim 10, wherein the piezoelectric substrate is lithium tetraborate.

12. A surface acoustic wave filter according to claim 11, wherein the piezoelectric substrate is an above 40° and below 45°-rotated x-cut and z-propagating lithium tetraborate.

13. A surface acoustic wave filter according to claim 10, wherein a natural number n for determining said gap L is equal to or less than 5.

14. A surface acoustic wave filter according to claim 13, wherein the piezoelectric substrate is lithium tetraborate.

15. A surface acoustic wave filter according to claim 14, wherein the piezoelectric substrate is an above 40° and below 45°-rotated x-cut and z-propagating lithium tetraborate.

* * * * *